(12) United States Patent
Wu

(10) Patent No.: US 11,257,672 B2
(45) Date of Patent: Feb. 22, 2022

(54) SEMICONDUCTOR DEVICES INCLUDING ACTIVE REGIONS IN RAM AREAS WITH DEPOSITION DETERMINED PITCH

(71) Applicant: GLOBALFOUNDRIES U.S. Inc., Santa Clara, CA (US)

(72) Inventor: Nan Wu, Dresden (DE)

(73) Assignee: GlobalFoundries U.S. Inc., Santa Clara, CA (US)

( * ) Notice: Subject to any disclaimer, the term of this patent is extended or adjusted under 35 U.S.C. 154(b) by 100 days.

(21) Appl. No.: 15/978,334

(22) Filed: May 14, 2018

(65) Prior Publication Data

US 2019/0348280 A1 Nov. 14, 2019

(51) Int. Cl.
| | |
|---|---|
| *H01L 21/027* | (2006.01) |
| *H01L 21/475* | (2006.01) |
| *H01L 27/11* | (2006.01) |
| *H01L 21/28* | (2006.01) |

(52) U.S. Cl.
CPC .... *H01L 21/0274* (2013.01); *H01L 21/28141* (2013.01); *H01L 21/475* (2013.01); *H01L 27/1104* (2013.01)

(58) Field of Classification Search
CPC ........... H01L 21/0274; H01L 21/28141; H01L 21/475; H01L 27/1104; H01L 21/76813; H01L 21/76814; H01L 21/76816; H01L 21/0332; H01L 21/47573; H01L 21/0337
See application file for complete search history.

(56) References Cited

U.S. PATENT DOCUMENTS

| | | | |
|---|---|---|---|
| 9,123,776 B2 * | 9/2015 | Tsai | H01L 21/76802 |
| 10,199,259 B1 * | 2/2019 | Smith | H01L 21/76229 |
| 10,396,084 B1 * | 8/2019 | Smith | H01L 21/768 |
| 2007/0123037 A1 * | 5/2007 | Lee | H01L 21/0337 |
| | | | 438/636 |
| 2011/0183505 A1 * | 7/2011 | Min | H01L 21/0338 |
| | | | 438/586 |
| 2012/0129349 A1 * | 5/2012 | Kang | H01L 27/105 |
| | | | 438/700 |
| 2015/0155198 A1 | 6/2015 | Tsai et al. | |
| 2015/0179435 A1 * | 6/2015 | Wu | H01L 21/308 |
| | | | 438/702 |
| 2018/0315645 A1 * | 11/2018 | Schultz | H01L 21/0337 |

* cited by examiner

*Primary Examiner* — Latanya N Crawford Eason
(74) *Attorney, Agent, or Firm* — Hoffman Warnick LLC

(57) ABSTRACT

The present disclosure provides manufacturing techniques in which the layout pattern of a RAM cell may be obtained on the basis of a single lithography step, followed by a sequence of two deposition processes, thereby resulting in a self-aligned mechanism for providing the most critical lateral dimensions for active regions. In this manner, the smallest pitch of approximately 80 nm and even less may be accomplished with superior device uniformity, while at the same time reducing overall manufacturing complexity.

14 Claims, 10 Drawing Sheets

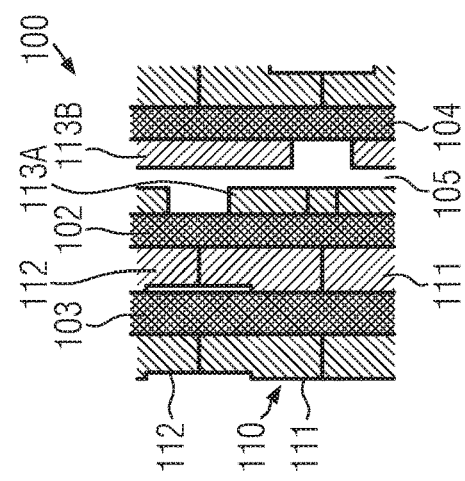
FIG. 1A
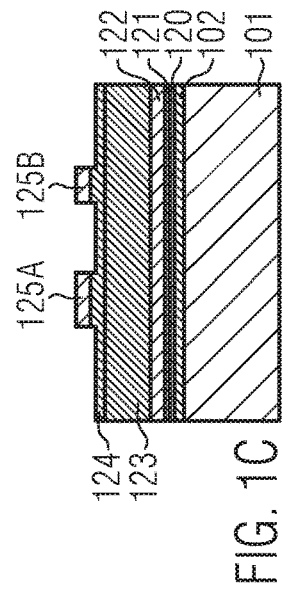
FIG. 1C
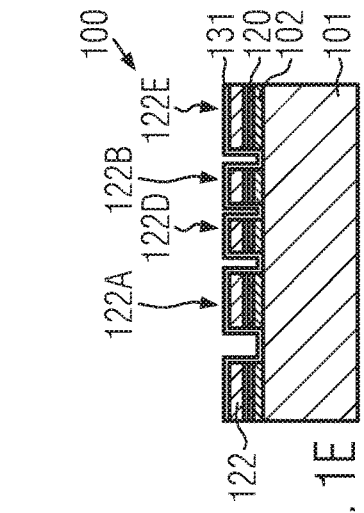
FIG. 1E
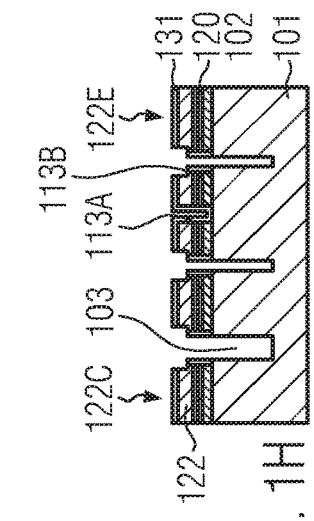
FIG. 1H
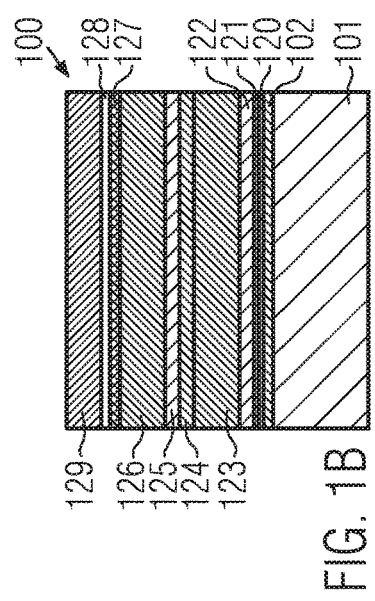
FIG. 1B
FIG. 1D
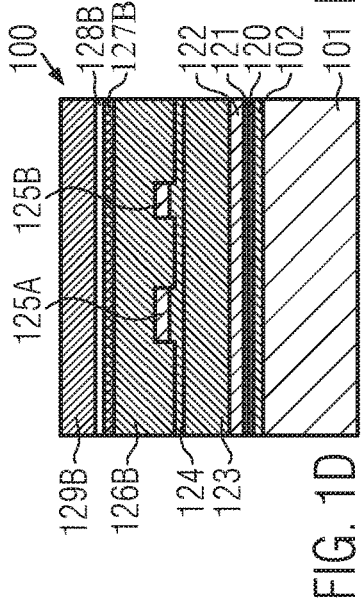
FIG. 1F
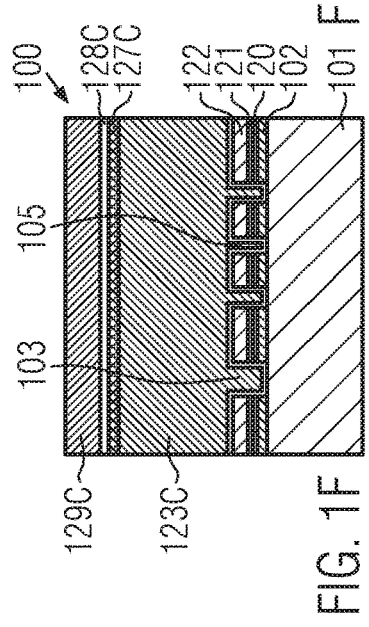
FIG. 1G

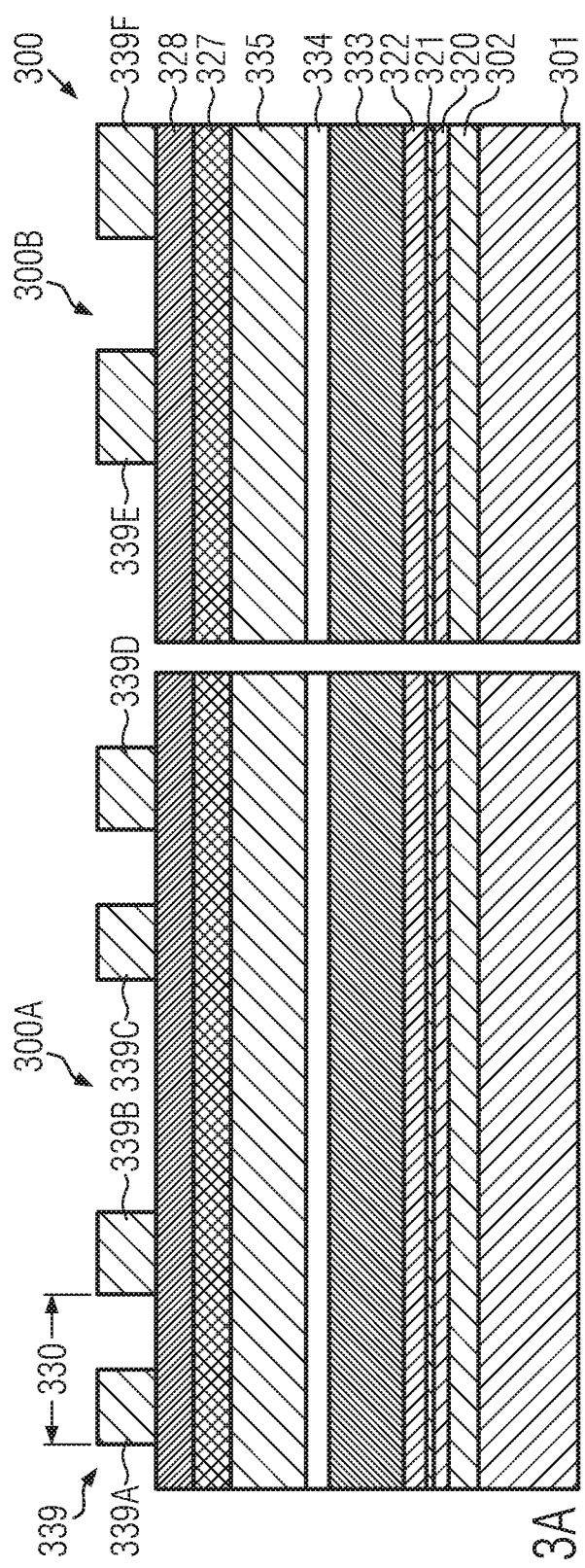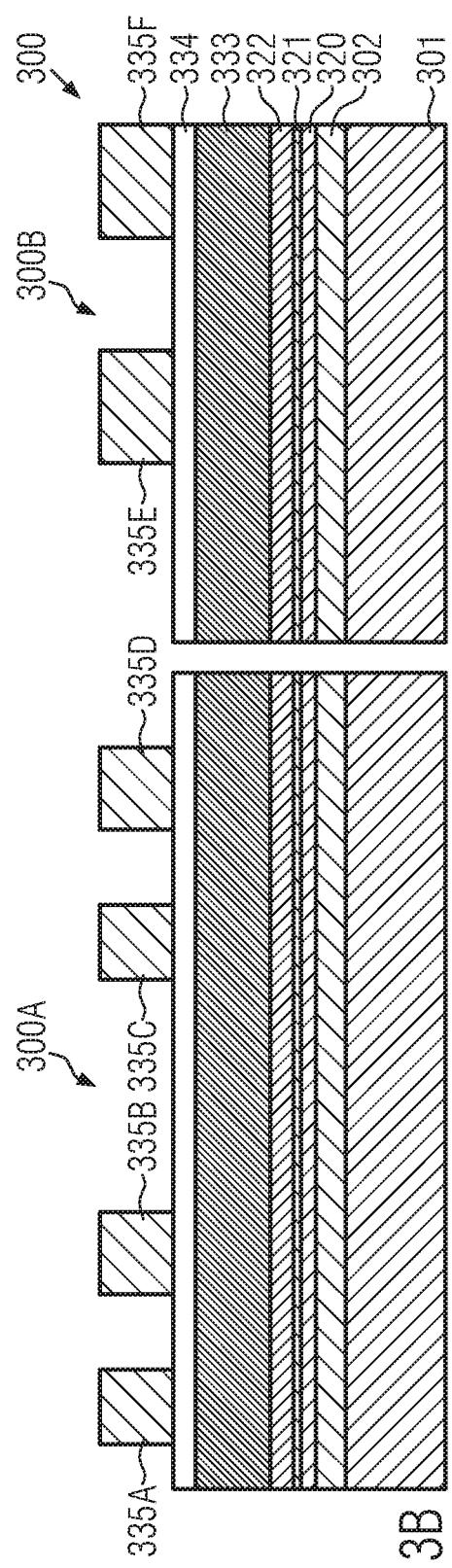
FIG. 3A
FIG. 3B

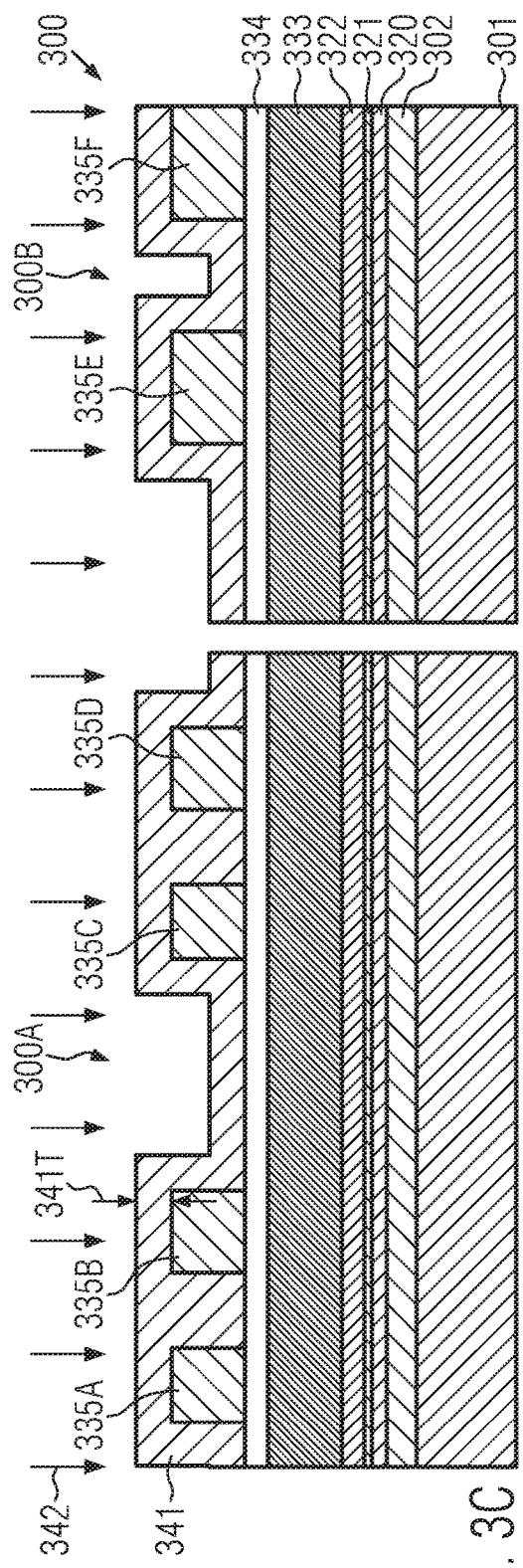
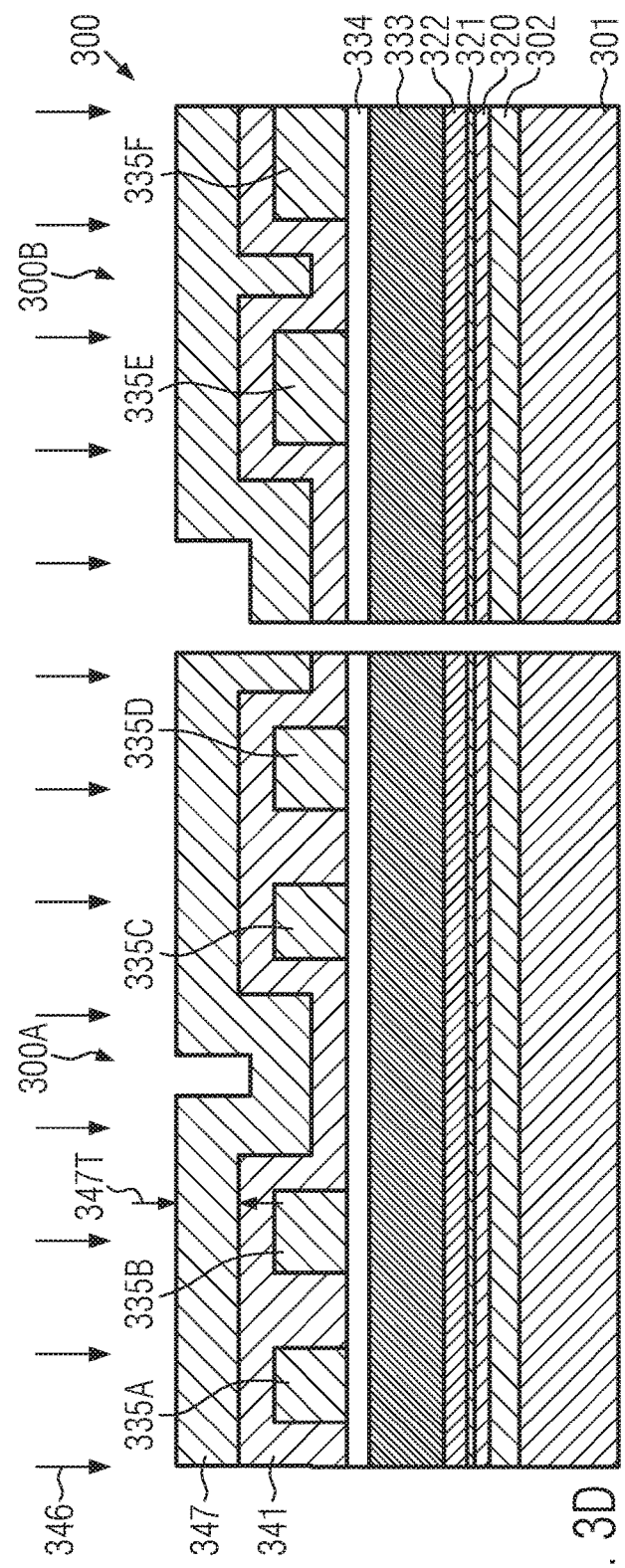
FIG. 3C
FIG. 3D

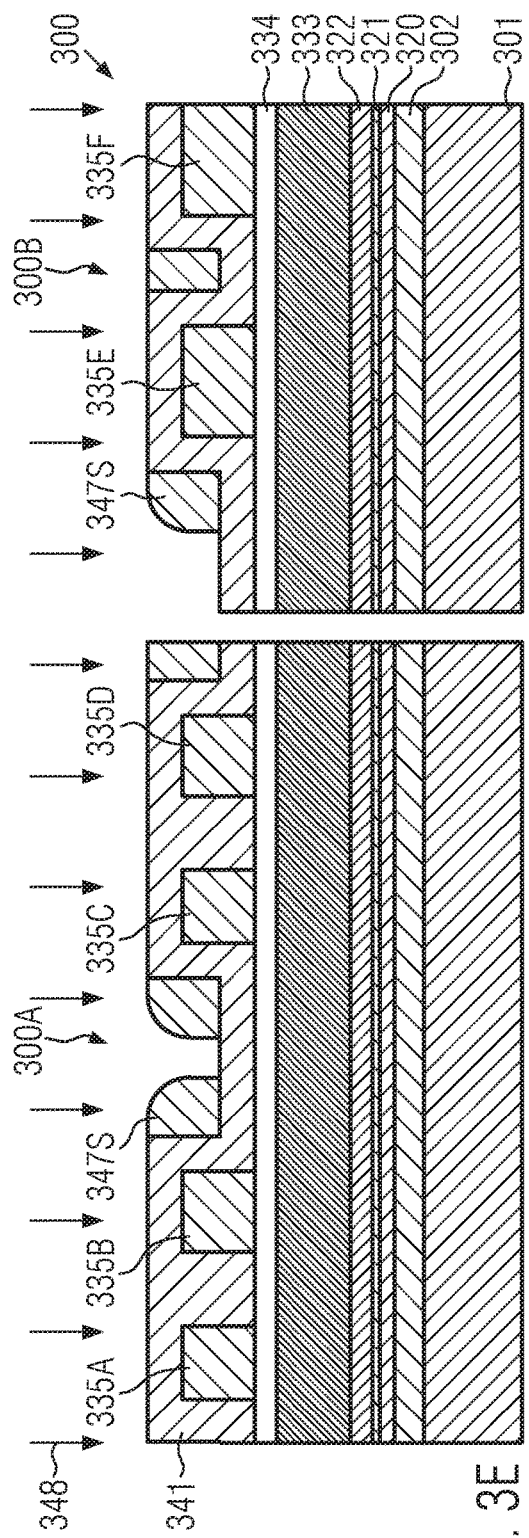
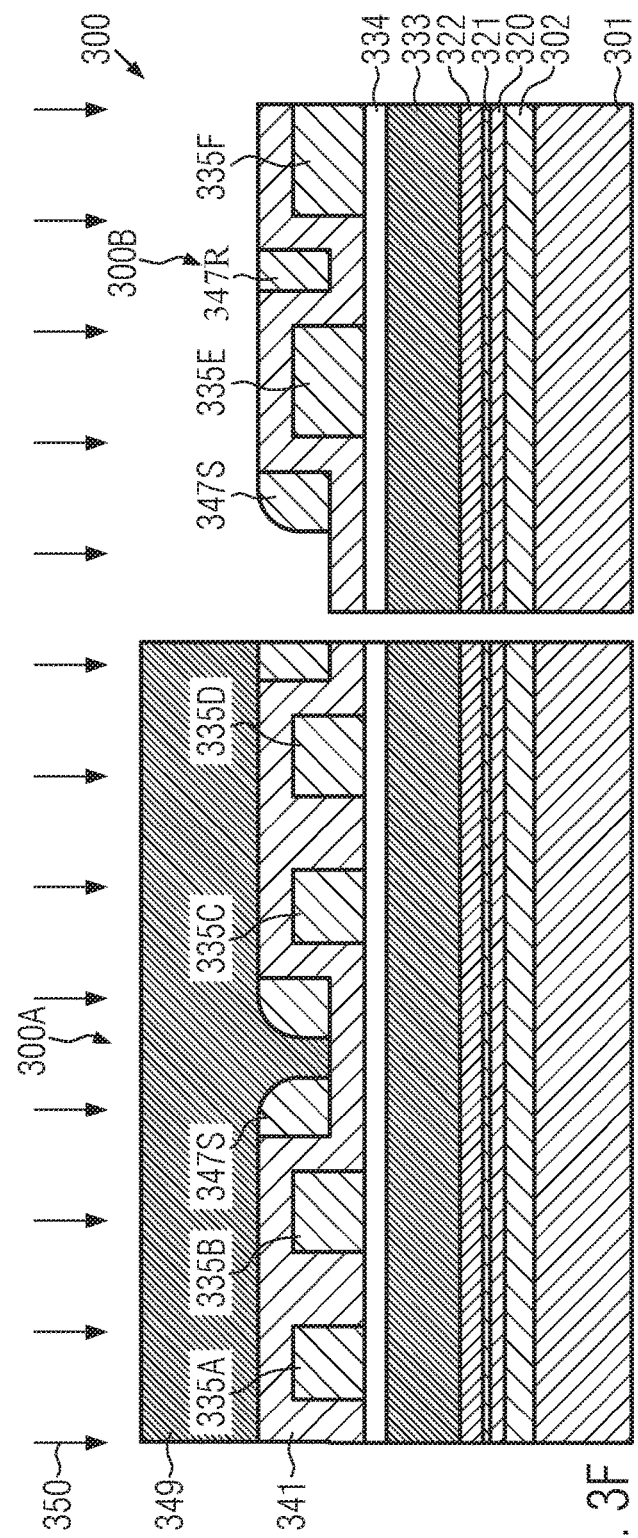

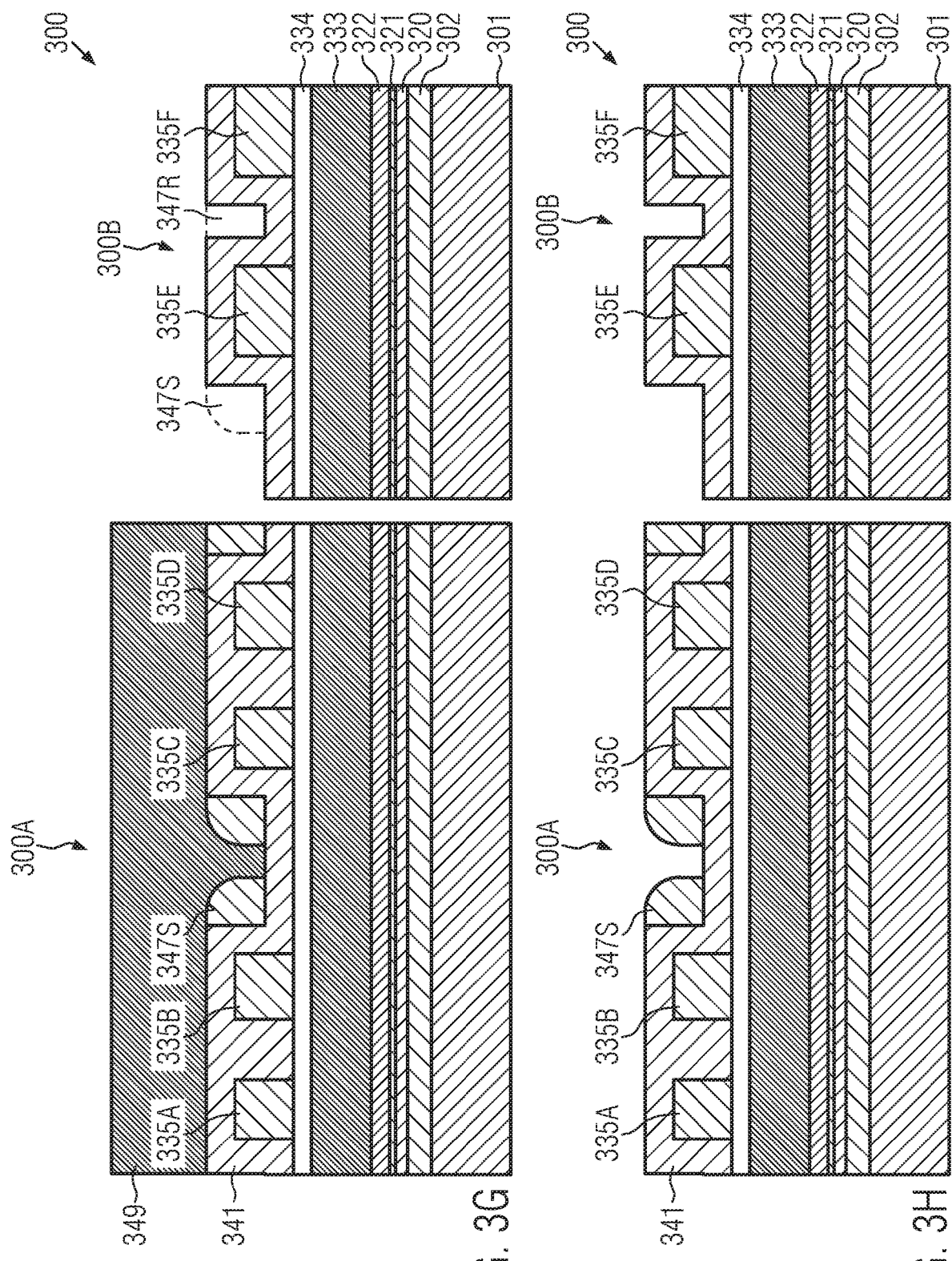

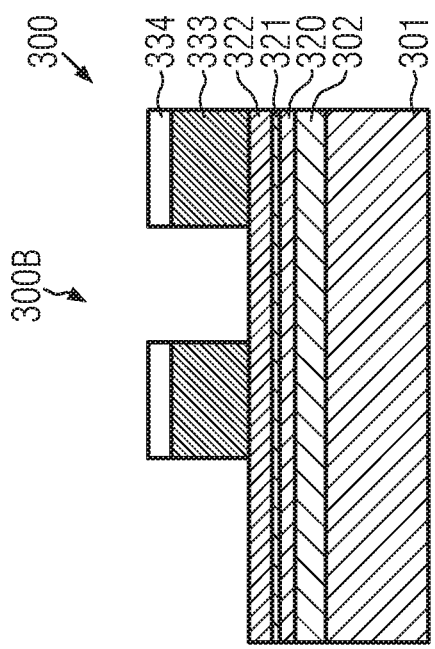
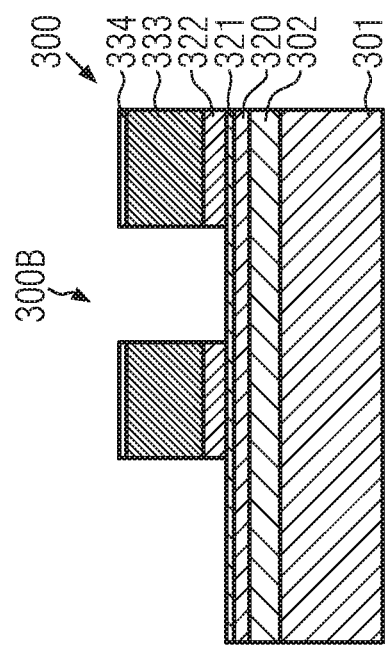
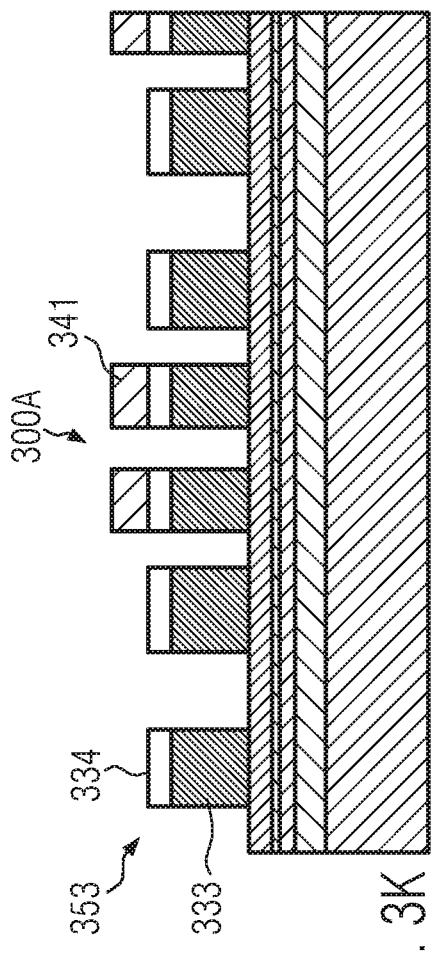
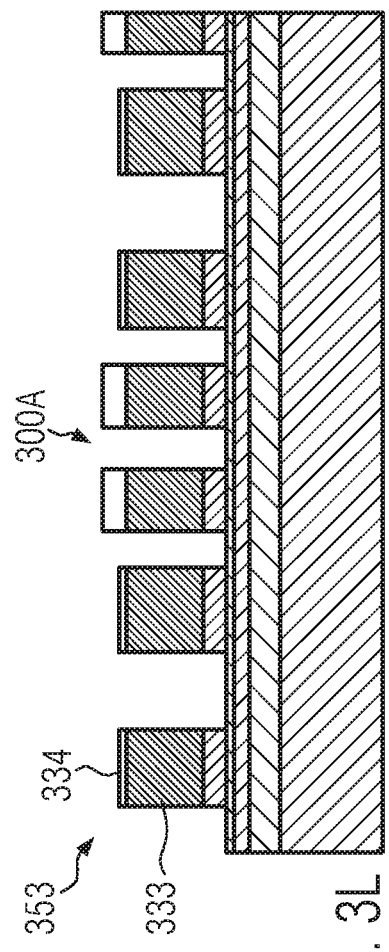

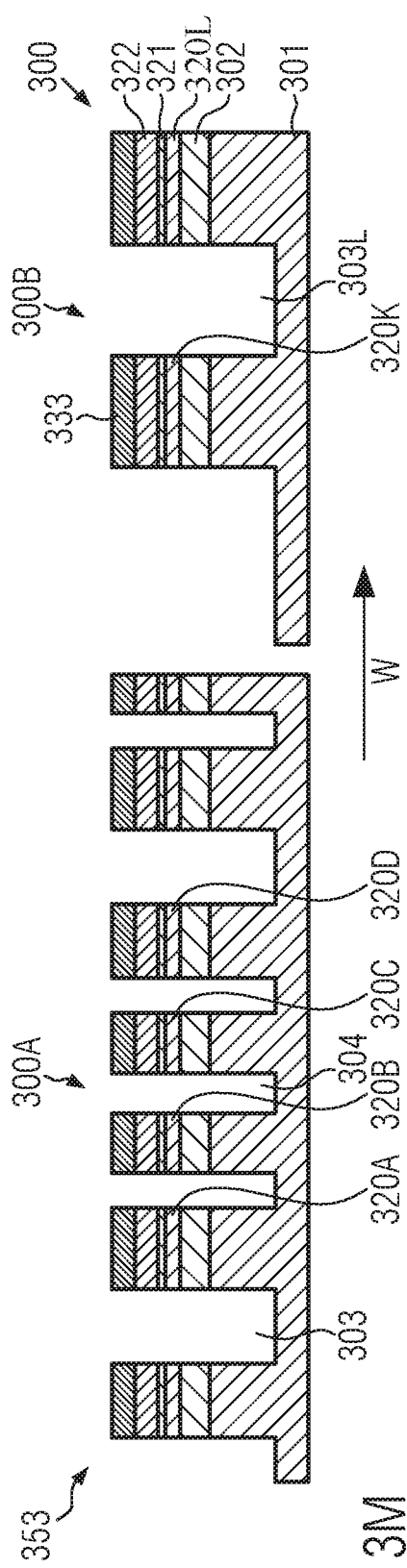
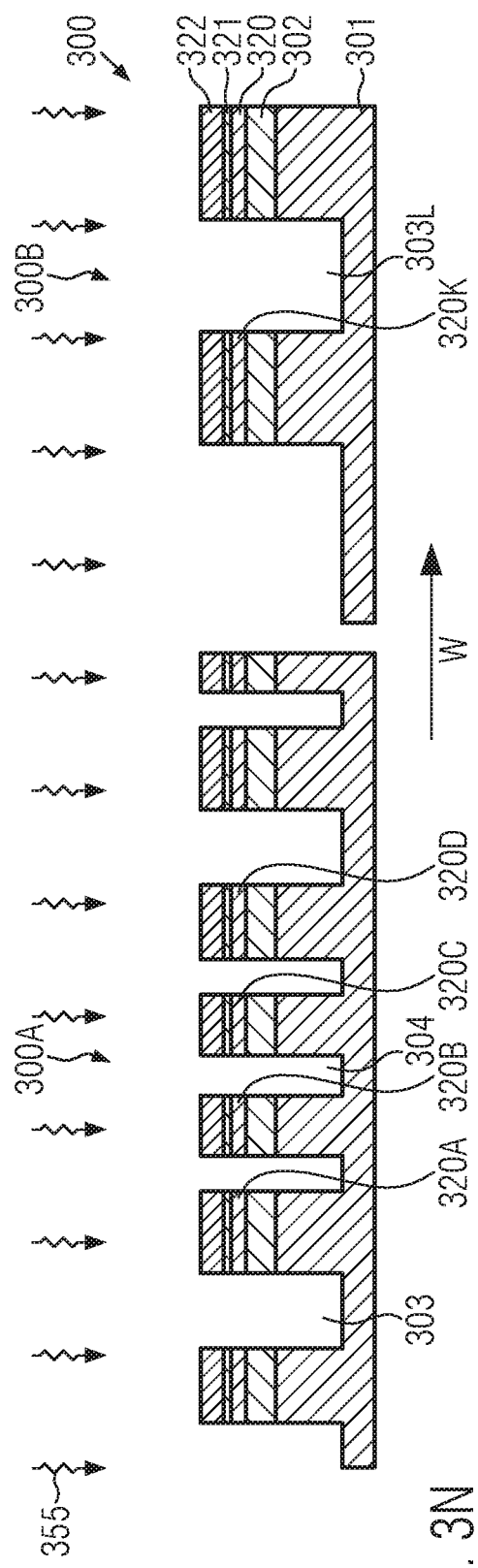
FIG. 3M
FIG. 3N

SEMICONDUCTOR DEVICES INCLUDING ACTIVE REGIONS IN RAM AREAS WITH DEPOSITION DETERMINED PITCH

BACKGROUND

1. Field of the Disclosure

The subject matter disclosed herein relates to semiconductor devices and techniques for forming active semiconductor regions to be used for forming transistor elements.

2. Description of the Related Art

Integrated circuits are formed on the basis of a plurality of subsequent process steps in order to form tiny regions of precisely controlled size in one or more material layers of an appropriate substrate. These tiny regions of precisely controlled size are typically obtained by applying lithography, etch, implantation and deposition techniques, and the like, at various manufacturing stages in order to pattern the material layer or layers in accordance with the underlying device design.

The patterning of material layers formed on the substrate material may be typically accomplished by forming a type of mask layer, which may consist of or may be formed by means of a layer of resist material that is patterned by a lithography process, typically a photolithography process. To this end, the resist may be spin-coated onto the substrate surface and may then be selectively exposed to ultraviolet radiation through a corresponding lithography mask, such as a reticle, in order to image the reticle pattern into the resist layer, thereby forming a latent image therein. After developing the resist material, other mask features and, finally, the actual device pattern may be formed by further manufacturing processes, such as etching and the like. Since the dimensions of the patterns in sophisticated semiconductor devices are continuously reduced, the finally accomplished resolution of the optical patterning process may, therefore, depend significantly on the imaging capability of the equipment used, the photoresist materials for the specified exposure wavelength, and the target dimensions of the device features to be formed in the device level under consideration. For example, in current critical lithography steps, an exposure wavelength of 193 nm (ArF laser) may be used, wherein, in recent developments, numerical aperture and depth of focus, in particular, have been significantly improved by implementing a so-called "immersion" technique. In this immersion technique, a liquid of appropriate index of refraction is provided between the last lens of the complex optical system and the semiconductor substrate that receives the light pattern through a corresponding lithography mask.

In presently available sophisticated semiconductor devices, critical dimensions of specific device features, such as gate electrode structures of field effect transistors, active semiconductor regions, i.e., the semiconductor material in and on which respective transistor elements have to be formed, have reached values that are significantly below the wavelength of the exposure radiation for initially forming the respective resist mask. In order to obtain the required critical dimensions, highly non-linear processes and specific measures, such as the provision of immersion liquid and the like, may have to be applied in order to arrive at the required target dimensions well below the optical resolution. For example, extremely non-linear photoresist materials may be used in which a desired photochemical reaction may be initiated on the basis of a well-defined threshold so that weakly exposed areas may not substantially change at all, while areas having exceeded the threshold may exhibit a significant variation in the chemical stability with respect to a subsequent development process.

Furthermore, additional process techniques may be applied, which may enable a further reduction of the resist features, thereby providing the capability of further reducing the critical dimensions of circuit elements. For example, appropriate hard mask features may be formed on the basis of sophisticated trim etch and deposition techniques, thereby enabling the patterning of gate electrode structures, active regions and the like, with critical dimensions that substantially correspond to the previously adjusted dimensions of the mask features.

In recent developments, various approaches have been taken in order to design highly complex integrated circuits with critical dimensions of 30 nm and significantly less, wherein, on the one hand, three-dimensional transistor architectures are implemented, thereby requiring highly complex manufacturing strategies. In other approaches, transistor performance has been significantly improved on the basis of well-established planar transistor architectures, for instance, by employing fully depleted semiconductor regions, above which highly complex, yet well-established electrode structures may be formed. In this context, a planar transistor architecture is to be understood as an architecture in which a channel region, i.e., the region in which current flow between a source region and a drain region of a field effect transistor is controlled on the basis of an electric field, has a substantially planar geometry, i.e., the current flow takes place in the vicinity of a single surface area without providing a plurality of angled surface areas for current flow control, as is the case in three-dimensional transistor architectures. A fully depleted configuration in at least a portion of a channel region of a planar transistor element may be basically accomplished by using a very thin semiconductor material, such as a crystalline silicon material, a crystalline silicon/germanium material and the like, with an initial thickness of approximately 15 nm and significantly less, thereby achieving high performance while still avoiding a plurality of manufacturing challenges typically associated with the formation of three-dimensional transistor architectures.

When forming sophisticated transistor elements based on planar device architecture, the respective thin basic semiconductor material has to be laterally patterned, i.e., respective isolation trenches may have to be formed, which may have different depth and dimensions depending on the overall design criteria. In particular, in densely packed device areas, such as static RAM (random access memory) areas in complex semiconductor devices, the task of providing active regions with appropriate lateral size and shape is an extremely challenging process phase, since, in this case, extremely reduced critical dimensions may have to be implemented in order to improve, for instance, overall packing density. For example, the total area of a RAM cell may have a significant influence on the overall packing density, since extended RAM areas may be required for many types of complex control circuitry. Typically, different types of transistor elements may have to be combined in a typical RAM cell design, such as pull-up transistors, pull-down transistors, pass gate transistors, which may require different characteristics with respect to their current-carrying capacity, so that, in view of increased overall packing density, the different current-carrying capacitors may be accomplished by providing different transistor width dimensions for an otherwise relatively similar transistor configuration. As a consequence, densely packed active regions may have to be provided in critical device areas with precisely defined size and shape in order to ensure proper functionality at a desired high packing density.

In currently available techniques, the active regions of sophisticated transistor elements having a planar architecture may be obtained on the basis of a complex process sequence, including repeated lithography-etch sequences based on highly sophisticated immersion-based lithography techniques. That is, a repeated sequence of sophisticated lithography-etch steps may be required for, firstly, defining respective deeper trenches for delineating active regions in the form of stripes along a certain lateral direction, followed by further lithography and etch sequences for separating the stripes by an isolation trench in the orthogonal lateral direction. For example, the former process phase for forming the active region stripes with defined width may require three immersion-based lithography steps. Consequently, a relatively large number of sophisticated lithography processes may contribute to significant overall manufacturing costs. Moreover, in view of device performance, the various highly critical lithography processes may have to be aligned with respect to each other, thereby necessarily introducing certain variability due to unavoidable overlay errors determined by the overall capabilities of the respective lithography processes. A corresponding process strategy for critical device areas, such as static RAM areas, in which at least two different widths and pitches of active regions may have to be met due to respective design requirements as discussed above, may, therefore, result in reduced flexibility with respect to further scalability of respective designs, since lithography-based variations in width and pitch may have to be accounted for by the basic device design.

In view of the situation described above, the present disclosure relates to semiconductor devices and manufacturing techniques in which sophisticated patterning regimes may be applied to active regions for sophisticated planar transistor elements, while avoiding or at least reducing the effects of one or more of the problems identified above.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is based on the concept that the most critical lateral dimensions in a width direction of active semiconductor regions may be accomplished on the basis of a non-lithography process by using deposition techniques for which highly controllable deposition recipes are available in the field of semiconductor production. That is, according to the findings of the present disclosure, a basic non-complete circuit pattern may be established on the basis of a lithography process, which, in some illustrative embodiments, may even be performed on the basis of less critical conditions, wherein only pattern elements of less critical width and space and, thus, pitch may be provided. Additional pattern elements may be introduced on the basis of deposition processes in combination with appropriate removal techniques so that, starting from the lithography-based pattern, the target pattern may be obtained with critical dimensions defined by the deposition-related process parameters. Consequently, instead of introducing process and device variations caused by repeatedly performed lithography processes, including respective overlay imperfections, the target device pattern for forming active regions may be obtained in a self-aligned manner with respect to the initially provided incomplete non-critical mask pattern, followed by a process sequence in which pattern variations may only be determined by deposition and etch related non-uniformities, which may be typically less pronounced compared to variabilities caused by a sequence of complex lithography processes. Therefore, even in device areas with high packing density, such as static RAM areas, most critical pitches, for instance, width and space between pull-up transistors, may be established with reduced variability compared to conventional strategies, thereby providing the possibility for further scalability of critical device areas on the basis of a given basic transistor architecture, such as a planar transistor configuration.

One illustrative embodiment disclosed herein relates to a method including forming first mask elements from a hard mask layer on the basis of a resist mask, wherein the hard mask layer is formed above a semiconductor layer of a semiconductor device. The method further includes conformally depositing a first mask layer above the first mask elements and conformally depositing a second mask layer above the first mask layer, wherein the second mask layer has etch selectivity with respect to the first mask layer. The method further includes forming second mask elements from the first and second mask layers. Additionally, the method includes forming stripes of active regions from the semiconductor layer by using the first and second mask elements as an etch mask.

A further illustrative embodiment disclosed herein relates to a method of forming active regions in a semiconductor device. The method includes forming a pattern of first mask elements on the basis of a first lithography process. Moreover, second mask elements are formed in between the first mask elements by applying a sequence of deposition processes. The method further includes separating a semiconductor layer into a plurality of active regions along a width direction by etching by using the first and second mask elements as an etch mask. Additionally, the method includes separating a plurality of active regions along a length direction on the basis of a second lithography process.

A still further illustrative embodiment discloses herein relates to a method of forming stripes of active region of a semiconductor device. The method includes forming a resist mask above a stack of layers including a semiconductor layer and a hard mask layer positioned above the semiconductor layer. Furthermore, the hard mask layer is patterned by using the resist mask so as to form first mask elements from the hard mask layer. Moreover, a first mask layer is deposited above first mask elements and a second mask layer is deposited above the first mask layer. The method further includes etching the second mask layer selectively to the first mask layer so as to form sidewall spacer elements on the first mask layer adjacent to sidewalls of the first mask elements. Additionally, the method includes etching the first mask layer selectively to the sidewall spacer elements and the first mask elements so as to form second mask elements from the sidewall spacer elements. Finally, the method includes etching through the semiconductor layer and using the first and second mask elements as an etch mask.

BRIEF DESCRIPTION OF THE DRAWINGS

The disclosure may be understood by reference to the following description taken in conjunction with the accompanying drawings, in which like reference numerals identify like elements, and in which:

FIG. 1A schematically illustrates a top view of a semiconductor device, wherein a portion of a RAM cell or the layout thereof is illustrated;

FIGS. 1B and 1C schematically illustrate cross-sectional views of the semiconductor device during a process flow in which active regions may be patterned on the basis of a sequence of lithography processes, wherein FIG. 1C illustrates mask elements obtained after a first lithography process;

FIGS. 1D and 1E schematically illustrate cross-sectional views of the semiconductor device in further advanced stages of the patterning of active regions based on a further lithography process;

FIGS. 1F-1H schematically illustrate cross-sectional views of the semiconductor device for patterning active regions based on a third lithography process, according to sophisticated conventional strategies;

Figure 2:
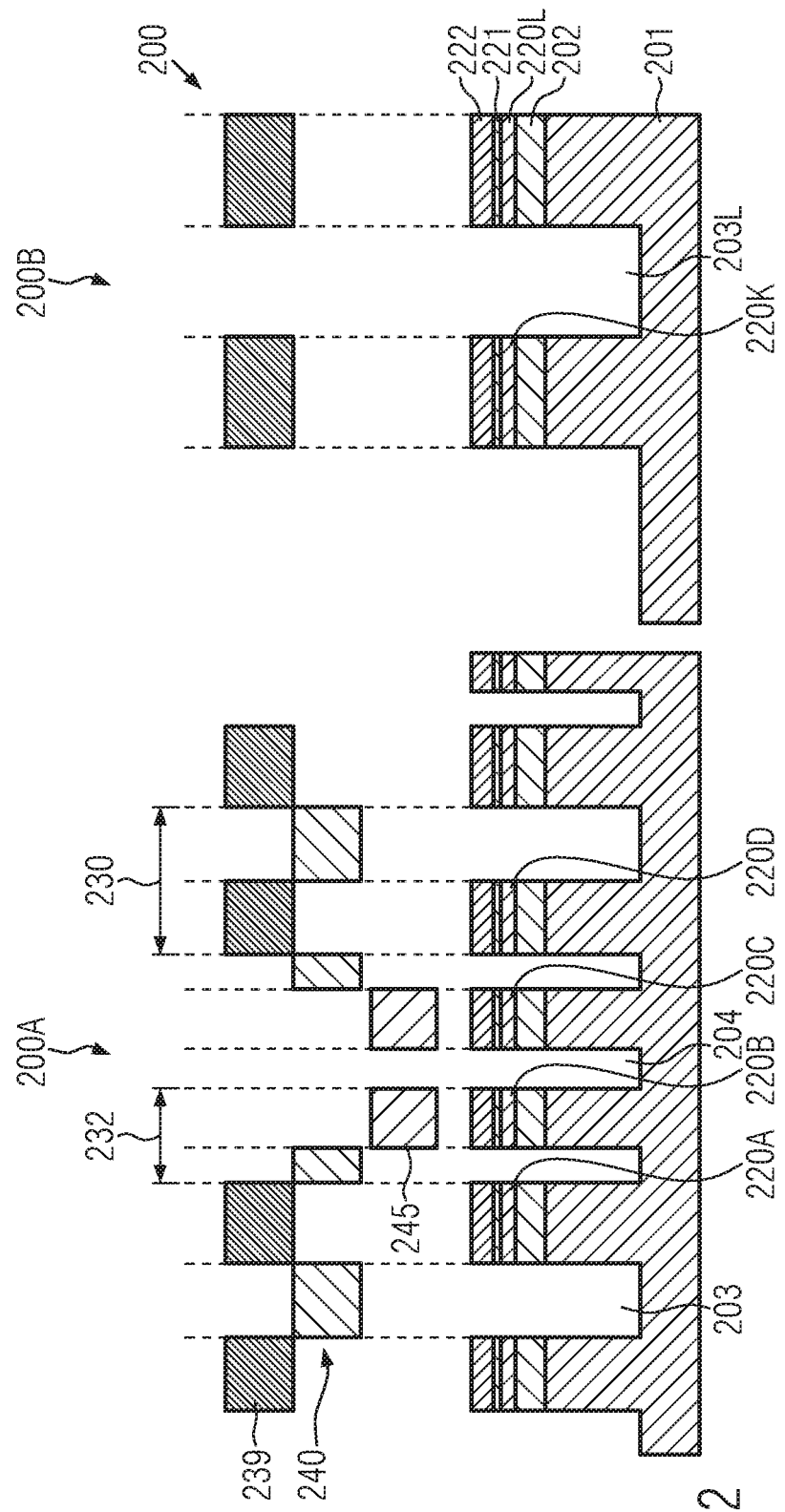
FIG. 2 schematically illustrates concepts of the present disclosure according to illustrative embodiments, wherein a semiconductor device is illustrated in cross-sectional view and respective critical dimensions are illustrated, which may be obtained on the basis of a single critical lithography process and a deposition sequence of mask layers.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the invention. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Generally, in sophisticated semiconductor devices implementing planar transistor architecture for sophisticated transistor elements, significant efforts have to be made in order to obtain critical dimensions that are well below the wavelength of the basic lithography process used for forming respective mask patterns. In particular, in densely packed device areas, such as RAM areas, extremely complex lithography and masking strategies may have to be applied in order to obtain the critical pitches, i.e., width and space, of neighboring circuit elements, such as active regions, thereby contributing to significant overall manufacturing costs, since complex lithography processes are one of the most expensive process steps during the fabrication of semiconductor devices. In particular, immersion-based lithography processes may add to overall process complexity.

With reference to FIGS. 1A-1H, a respective complex process strategy will now be described in more detail in order to illustrate the technical problems involved, in particular, when critical dimensions have to be further reduced in critical device areas, such as RAM areas.

FIG. 1A schematically illustrates a top view of a semiconductor device 100 or a layout thereof in which a portion of a RAM area is illustrated. As is well known, a typical RAM cell may represent the combination of a plurality of transistor elements, which, in some illustrative embodiments disclosed herein, may be provided in a planar transistor configuration, thereby avoiding complex patterning processes as may be required when implementing three-dimensional transistor elements. For example, in typical applications, six transistor elements may be provided per RAM cell, i.e., a pull-up transistor and a pull-down transistor combined to an inverter, a further inverter composed of a further pull-up transistor and a pull-down transistor, wherein these inverters may be cross-coupled so as to form a storage element. Furthermore, the respective nodes of the cross-coupled inverters may be connected to respective bit lines on the basis of pass gate transistors. As is well known in the art, these transistors may typically require different current-carrying capacities, which may be accomplished, when using a commonly applied transistor configuration, by implementing different width dimensions of the respective transistor elements. That is, the width dimension of respective active regions may be appropriately dimensioned so as to obtain a different current-carrying capacity.

Thus, the semiconductor device 100 may include a plurality of stripe-like active regions 110, which may have appropriate dimensions along a width direction, i.e., in FIG. 1A, the horizontal direction, in order to comply with the respective current-carrying capacities, as discussed above. For example, a first stripe of the active regions 110 may include an active region or portion thereof 111 having an appropriate width that corresponds to a pull-down transistor (not shown), while, in a further extension of this active region, a region 112 may be provided and may have a width that corresponds to a pass gate transistor element. Similarly, respective stripes 113A, 113B (collectively referred to as 113) for pull-up transistors may be provided and may have a reduced width compared to pull-down and pass gate transistors in order to ensure reduced current-carrying capacities of the pull-up transistors. Furthermore, appropriately dimensioned isolation regions 103, 102 may be provided between neighboring stripes of active regions, wherein respective width dimensions may also represent critical dimensions so as to reliably separate respective active regions along the width direction. Moreover, respective isolation regions 104 may be provided so as to appropriately separate respective active regions along a length direction, i.e., in FIG. 1A, the vertical direction. As is evident from FIG. 1A, a sum of width and space, for instance, the width of active region 113A and the width of space 105, may represent a critical pitch, which may be selected so as to be within the respective patterning capabilities of the process sequence applied. In sophisticated conventionally applied strategies, the critical pitches may not be achieved in a single lithography process and, therefore, a plurality of lithography-etch sequences may be applied in order to subsequently form mask patterns, which may be finally used for etching through the respective semiconductor layer in order to obtain the plurality of active regions with a basic configuration as illustrated in FIG. 1A.

FIG. 1B schematically illustrates a cross-sectional view of the semiconductor device 100 when actually implemented in a semiconductor material. In this manufacturing stage, the semiconductor device 100 may include a substrate 101, such as a crystalline silicon material, silicon/germanium, silicon/carbon material, and the like, or any other carrier material having formed thereon a crystalline semiconductor layer. Furthermore, as discussed above, in sophisticated semiconductor devices using planar transistor architecture, frequently an SOI (semiconductor- or silicon-on-insulator) architecture may be applied at least in some device areas, which may be accomplished by providing a buried insulating layer 102 of appropriate material composition, for instance, comprising standard dielectric materials, such as silicon dioxide, silicon nitride, silicon oxynitride and/or high-k dielectric materials and the like. The semiconductor device 100 may further include a semiconductor layer 120 having any appropriate material composition, for instance, comprising crystalline silicon material, crystalline silicon/germanium material, silicon/carbon material and the like. In sophisticated applications, as discussed above, the initial semiconductor material 120 may be provided with a reduced thickness of 15 nm and significantly less in order to form transistor elements including a fully depleted channel region. It should be appreciated that, in the manufacturing stage shown, the semiconductor layer 120 may be locally adapted to the specific requirements for transistor elements to be formed in and on the semiconductor layer 120. For example, in some areas, the material composition and/or doping may differ from other areas, for instance, when forming P-type transistors, such as pull-up transistors, and N-type transistors, such as pull-down transistors, pass gate transistors and the like.

A thin protective layer 121, for instance, in the form of a silicon dioxide layer, may be formed above the semiconductor layer 120, followed by a further protective layer or mask layer 122, which may be provided in the form of silicon nitride and the like. Moreover, a planarization layer 123, such as a polymer layer, may be provided, followed by a further mask layer 124, for instance, in the form of silicon dioxide, followed by a further mask layer 125, such as a silicon nitride layer. Furthermore, a further planarization layer 126, such as a polymer layer, may be provided, followed by a lithographer layer stack comprising a silicon oxynitride layer 127, a bottom anti-reflective layer 128, and a resist layer 129.

The complex layer stack of the device 100 may be formed on the basis of well-established deposition techniques.

Based on the layer stack as shown in FIG. 1B, a critical lithography process may be applied, in sophisticated applications typically an immersion-based lithography process using an ArF laser source in combination with an appropriate lithography reticle for forming a latent image in the resist layer 129 in accordance with the mask pattern included in the respective lithography reticle. For example, in the first lithography process of a sequence of three processes, a latent image may be generated corresponding to stripes representing the active regions 111, 112 and 113B. Thus, after developing the resist layer 129, the corresponding resist pattern (not shown) may be transferred into the lower lying layers of the layer stack, thereby finally forming respective mask elements in the mask layer 125.

FIG. 1C schematically illustrates the semiconductor device 100 after completing the above-described process sequence. As illustrated, mask elements 125A, 125B may be formed from the layer 125 (see FIG. 1B), which may correspond in size and position substantially to the stripes 111, 112 on the one hand and 113B on the other hand, as discussed above. During patterning of the layer 125 for forming the mask elements 125A, 125B, the underlying layer 124 may be used as an etch stop layer.

FIG. 1D schematically illustrates a cross-sectional view of the semiconductor device 100 after providing a further layer stack adjacent to and above the previously formed mask elements 125A, 125B. For example, a further planarization layer 126B followed by a lithography stack 127B, 128B, 129B may be formed and may exhibit substantially the same characteristics as the corresponding layers as described in the context of FIG. 1B. As previously discussed, since a respective minimum pitch, for instance, the width of the stripe 113A and the space 105 (see FIG. 1A) may not be within the capability of a single lithography process, a further lithography process, for instance, an immersion-based ArF lithography process, may be applied, similar to the process previously used for forming the mask elements 125A, 125B. As discussed above, a respective process may include overlay techniques so as to appropriately align the corresponding resist mask to be formed from the resist layer 129B with the previously formed mask elements 125A, 125B, thereby inevitably introducing a certain degree of variability.

FIG. 1E schematically illustrates the semiconductor device 100 in a further advanced manufacturing stage after having patterned the layer stack as shown in FIG. 1D and after continuing the respective patterning sequence so as to form respective mask elements 122A . . . 122E in the layer stack formed of the layers 122, 121 and extending through the semiconductor layer 120 and the buried insulating layer 102. It should be appreciated that the mask elements 122A, 122B may be formed on the basis of the previously formed mask elements 125A, 125B (see FIG. 1D), while the remaining mask elements originate from the additional lithography process formed on the basis of the resist layer 129B (see FIG. 1D). Moreover, in this manufacturing stage, a liner 131 may be conformally formed above the patterned surface area of the semiconductor device 100.

FIG. 1F schematically illustrates the semiconductor device 100 prior to performing a further critical lithography process based on the previously established mask pattern. To this end, appropriate material layers, such as a planarization layer 123C, followed by a lithography stack, for instance, comprising layers similar to those discussed above, 127C, 128C, 129C, may be formed and may be subsequently patterned so as to provide appropriate mask elements in order to expose the areas for the "deep" trenches, such as 103, while covering the area of the space 105.

FIG. 1G schematically illustrates the semiconductor device 100 during an etch sequence in which a respective resist pattern (not shown) may have been transferred into the planarization layer 123C (see FIG. 1F) and may be used during the advance of the etch sequence as an etch mask. That is, respective mask elements 123D . . . 123G may act as an etch mask for forming deep trenches extending into the substrate material 101, such as the trench 103, while the "shallow" trench 105 may be reliably covered by the mask element 123F. As is evident, due to overlay imperfections and other process\-related variations, the size and shape of the mask elements 123D . . . 123G may not perfectly correspond to the lateral size and shape of the previously formed mask elements 122C . . . 122E, thereby contributing to a certain degree of device variability.

FIG. 1H schematically illustrates the semiconductor device 100 after completing the above-described process sequence for forming the deep trenches, such as the trench 103, and after removing any residues of the mask elements 123D . . . 123G (see FIG. 1G). Consequently, the mask elements 122C . . . 122E may still be present, however, with a certain variation in lateral size and shape compared to these mask elements obtained after the second lithography process, as discussed in the context of FIG. 1E. Hence, a certain degree of variability may also have been or may be transferred into the underlying active regions, such as the region 112 and the regions 113A, 113B during the further processing. It should be appreciated that a further lithography process is required for separating respective active regions along a length direction, i.e., in FIG. 1H, the direction perpendicular to the drawing plane of FIG. 1H, in order to obtain appropriately separated active regions. For instance, as shown in FIG. 1A, in the corresponding lithography process, which may also require sophisticated lithography techniques, the space or region 104 may be formed.

As already discussed above, the above-described process sequence may enable the formation of RAM areas with critical lateral dimensions, which have to be defined in different separate process sequences in order to obtain a minimum pitch that is below the capabilities of a single lithography process sequence. In this manner, however, any process-related variations, in particular overlay imperfections, may translate into the finally obtained pattern of active regions, which may have to be taken into account when designing an efficient RAM cell and respective transistor elements.

It turns out, however, that, upon further scaling respective designs in an attempt to enhance packing density of RAM areas, the plurality of process variations introduced during the three critical lithography sequences may result in significant difficulties in providing an appropriate layout that ensures proper functionality. Moreover, since lithography processes based on immersion techniques may represent one of the most cost-intensive process steps during semiconductor production, it is highly desirable to reduce the number of required critical lithography steps. Consequently, according to the principles of the present disclosure, the number of critical lithography steps may be reduced, while, in particular, the critical, i.e., the smallest pitch, in a complex RAM design may be determined by deposition-related process parameters, thereby contributing to a significant reduction of variability of the resulting active regions. In some illustrative embodiments disclosed herein, a single lithography step may suffice in forming a basic resist mask pattern and thus a basic hard mask pattern that may be modified during the further processing on the basis of deposition and etch techniques in order to obtain the remaining mask elements with the desired pitch on the basis of deposition-related variations. In some illustrative embodiments, the single lithography process may even be performed on the basis of less critical conditions, i.e., a less critical initial minimum pitch, thereby even providing the possibility of applying a non-immersion lithography technique.

With reference to FIG. 2, the basic concept may be described so as to obtain stripes of active regions which may be appropriately dimensioned and separated in a width direction of a semiconductor device.

FIG. 2 schematically illustrates a cross-sectional view of a semiconductor device 200, which may include a first device region 200A and a second device region 200B. For example, in the first device region 200A, a plurality of transistor elements may have to be formed on the basis of a planar transistor architecture grouped into functional units, such as RAM cells requiring minimum lateral dimensions, as also discussed above. On the other hand, the second device region 200B may represent any region in which transistor elements may have to be formed with less critical requirements with respect to transistor width, since, for instance, transistor elements with increased current-carrying capacity may be required. For example, in the second device region 200B, sophisticated transistor elements for time-critical signal paths, such as logic parts of the semiconductor device 200, may have to be provided.

The semiconductor device 200 may include a substrate material 201, a buried insulating layer 202 and a semiconductor layer 220. For these components, the same criteria as previously discussed in the context of the semiconductor device 100 may apply. That is, the transistor elements of the semiconductor device 200 may, in some illustrative embodiments, be formed on the basis of a fully depleted device configuration, thereby requiring a very thin crystalline semiconductor material, which, as also discussed above, may have characteristics in a locally varying manner, for instance, when providing the semiconductor base material for P-type transistors, N-type transistors, fast switching transistors and the like. For convenience, any such differences in material composition, doping and the like are not shown in FIG. 2. Furthermore, as discussed above, in sophisticated applications, the transistors may be provided in the form of SOI transistors, i.e., a transistor having an SOI (silicon- or semiconductor-on-insulator) architecture, thereby requiring the buried insulating layer 202, at least in areas of the semiconductor device 200 in which SOI transistors may have to be formed.

Furthermore, a protective liner 221, for instance, formed of silicon dioxide, followed by a further mask layer 222, for instance, in the form of silicon nitride, may be present, as also previously discussed. As shown, respective active regions 220A, 220B, 220C, 220D may have been formed, which may be understood as stripes of active regions, which are separated along a width direction, thereby adjusting the finally desired transistor width of respective transistor elements to be formed in and above the active regions 220A . . . 220D. As also discussed above, the active regions 220A . . . 220D may correspond to respective transistor elements, such as pull-down transistors, pass gate transistors, and pull-up transistors, wherein the latter may typically require a reduced transistor width. That is, the active regions 220B, 220C having the smallest width may correspond to active regions of pull-up transistors still to be formed. Furthermore, in this manufacturing stage, respective isolation regions in the form of trenches 203, 204 and the like may be provided so as to extend into the substrate material 201 to a desired depth.

Respective active regions 220K, 220L may be provided in the second device region 200B and may have less critical dimensions, as discussed above, and, therefore, a respective isolation region 203L may also have appropriate dimensions for separating the active regions along the width direction.

According to some illustrative embodiments, the lateral dimension of the respective active regions along the width direction may be obtained on the basis of a single lithography sequence. As indicated, at an initial "level" of the overall process strategy, a resist mask 239 may be provided and may define a basic pitch 230 in the first device region 200A. The pitch 230 may have to define a relatively non-critical width and a corresponding space of active regions still to be formed, for instance, the width of the active region 220A plus the width of the isolation region 203. In some illustrative embodiments, the respective pitch 230 may be selected so as to be within the capabilities of a specific type of lithography technique, wherein, in some illustrative embodiments, the pitch 230 may be selected to be approximately 115 nm when using immersion-based ArF lithography techniques and related patterning strategies as, for instance, discussed above in the context of FIGS. 1B and 1C.

In other illustrative embodiments, the resist mask 239 may be formed on the basis of a non-immersion lithography sequence when, for instance, selecting approximately 130 nm, which may be achievable by non-immersion ArF lithography.

A further level of the overall process strategy, following the level defined by the resist mask 239, i.e., a corresponding mask pattern obtained on the basis of the resist mask 239, may be implemented by a deposition sequence including at least two well-controllable deposition processes, such as ALD (atomic layer deposition) processes in which critical lateral dimensions may be defined with a variability determined by the underlying deposition techniques. For example, a pattern 240 as a next level of the process strategy may be obtained by a respective deposition process, thereby defining the lateral size of critical device features, such as the isolation region 204, which may be accomplished by precisely controlling the layer thickness during a respective conformal deposition process.

Thereafter, a deposition process may result in the formation of a further modified mask pattern 245 as the next level of the process strategy, which, for instance, may define the width of the most critical active regions, such as the regions 220B, 220C, wherein a self-aligned mechanism is also achieved with respect to the basic mask pattern (not shown) obtained on the basis of the resist mask 239.

Consequently, as is evident from FIG. 2, the most critical, i.e., the smallest pitch, indicated as 232, i.e., the sum of the width of the trench 204 and the width of the active region 220B, may, therefore, be defined on the basis of deposition processes without requiring any further pitch-defining lithography process. For example, the pitch 232 may be in the range of 80 nm and even significantly less, thereby providing the possibility of superior scalability of critical device areas based on a single lithography process.

On the other hand, in the second device region 220B, the respective critical dimensions may be exclusively defined on the basis of the resist mask 239. It should be appreciated, however, that the mechanism including the patterns 240, 245 may also be applied to transistor elements to be formed in the second device region 200B, if, at least for some transistor elements, respective reduced critical dimensions may be required.

With reference to FIGS. 3A-3O, further illustrative embodiments will now be described in more detail, wherein reference may also be made to the semiconductor device 200 of FIG. 2 and, if appropriate, to the semiconductor device 100 as discussed in the context of FIGS. 1A-1H.

FIG. 3A schematically illustrates a semiconductor device 300 comprising a first device region 300A and a second device region 300B, wherein, as also discussed in the context of FIG. 2, the first device region 300A may represent a device region requiring the formation of densely packed transistor elements, as discussed above. On the other hand, the second device region 300B may represent a logic portion and the like, wherein less critical conditions with respect to forming active regions may be encountered.

The semiconductor device 300 may include a substrate 301 and a buried insulating layer 302, at least in some device areas when an SOI architecture is to be implemented, as discussed above, followed by a semiconductor layer 320. It should be appreciated that, as discussed above, the layer 320 may include any appropriate crystalline semiconductor material, such as silicon, silicon/germanium, silicon/carbon and the like, as required for forming therein and thereabove respective transistor elements. For convenience, any differences in material composition, doping and the like are not shown in FIG. 3A. Moreover, a protective layer 321, for instance, in the form of silicon dioxide, followed by a further hard mask layer 322, such as a silicon nitride layer, may be provided, wherein similar criteria apply as discussed previously in the context of the semiconductor devices 100 and 200.

Moreover, a material layer 333, such as amorphous carbon, having appropriate stability, for instance, superior robustness compared to polymer layers, for instance, in terms of temperature stability and the like, may be formed above the layer 322. Furthermore, a mask layer 334 may be formed of any appropriate material, such as amorphous silicon, polycrystalline silicon and the like. Thereafter, a further mask layer 335 may be provided, for instance, in the form of silicon dioxide and the like. Next, a layer 327 may be formed as a further mask layer with appropriate material composition, such as silicon oxynitride and the like. Next, a bottom ARC layer 328, followed by a resist layer (not shown) may be provided. It should be appreciated that the thickness of the various layers may be selected in accordance with respective etch selectivities required during the further processing, as will be discussed later on in more detail, wherein any such thickness values for the various layers may be readily determined on the basis of experiments and the like. Furthermore, the respective layers may be formed in accordance with well-established deposition techniques based on well-established process recipes.

Next, a lithography process may be applied, for instance, in one illustrative embodiment in the form of an immersion-based lithography process, for instance, using an ArF laser source as a radiation source, while, in other cases, a less critical lithography may be applied, for instance, a non-immersion process based on an ArF laser source. After developing the resist layer, a resist mask 339 may be obtained having respective mask elements 339A . . . 339F, which, in the first device region 300A, may comply with the required design criteria for defining the basic pitch, indicated as 330, for instance, for defining the width dimensions of active regions or stripes of active regions for pull-down transistors and pass gate transistors of a RAM cell, as also discussed above. On the other hand, the resist elements 339E, 339F in the second device region 300B may have less critical dimensions, as also discussed above. Hence, the resist mask 339 may correspond to the resist mask 239 of the device 200, thereby establishing the first "level" of a patterning sequence in forming active regions with dimensions that are well below the lithography-determined pitches 230, 330. For example, a value of approximately 130 nm for the pitch 330 may be applied for non-immersion lithography, while a value of approximately 115 nm may be used when applying an immersion based lithography process. It should be noted, however, that, in other embodiments, any other basic pitch values may be selected depending on the design requirements.

On the basis of the resist mask 339, a sequence of process steps may be applied, for instance, for etching into the mask layer 327 in order to transfer the pattern of the resist mask 339 into the layer 327. Thereafter, the etch chemistry may be appropriately changed and a respective further anisotropic etch process may be applied so as to etch into the mask layer 335, while, on the other hand, in combination, the layers 339, 328 and 327 may provide for sufficient etch selectivity with respect to the material of the layer 335 in order to reliably finally transfer the pattern of the resist mask 339 into the layer 335. On the other hand, the layers 335 and 334 may be provided with sufficient etch selectivity so as to reliably stop the respective etch process on and in the layer 334.

FIG. 3B schematically illustrates the semiconductor device 300 after completion of the above-described process sequence. That is, respective mask elements 335A . . . 335D may form a mask pattern obtained from the layer 335 in accordance with the dimensions of the resist mask 339 (see FIG. 3A). On the other hand, in the second device region 300B, mask elements 335E, 335F corresponding in lateral size and position to the mask elements 339E, 339F may be obtained. On the basis of the pattern, including the mask elements 335A . . . 335F, the further level of the patterning strategy, for instance, as discussed in the context of FIG. 2 when referring to the pattern 240, may be applied so as to define a minimum space required in the finally obtained pattern of active regions.

FIG. 3C schematically illustrates the semiconductor device 300 during a deposition process 342 established on the basis of a deposition ambient, which is established so as to provide a highly conformal deposition behavior. For example, conformal CVD (chemical vapor deposition) techniques are readily available and ALD techniques have also been developed for a plurality of material systems in order to deposit layer for layer a desired material in a highly controllable manner. For example, plasma-enhanced ALD techniques for depositing silicon nitride are well established in the art and may be used during the deposition process 342. Consequently, during the process 342, a conformal mask layer 341 may be deposited with a desired and highly controllable thickness 341T that is selected so as to define a minimum space between vertical active regions still to be formed, as is also discussed for the pattern 240 in FIG. 2. Depending on the required minimum width of respective isolation regions, the thickness 341T may be selected in a range of approximately 10-30 nm in sophisticated RAM designs, while it should be appreciated that the concepts of the present disclosure may also be applied to less critical applications. Consequently, the lateral dimension and the lateral position of the device feature defined by the layer 341 are determined with a variability that mainly depends on the minor variation of the layer thickness 341T. In one embodiment, thickness 341T of layer 341 may be at least half of a distance between mask elements 335A and 335B, there within no additional mask element is to be made, such that layer 341 pinches off leaving no gap between mask elements 335A and 335B. The same may be said between mask elements 335C and 335D. On the other hand, layer 341 may not pinch off between mask elements 335B and 335C, there within additional mask elements are to be made as being made clear in the subsequent steps hereafter.

FIG. 3D schematically illustrates the semiconductor device 300 in a further advanced manufacturing stage, in which a further conformal deposition process 346 may be applied in order to form a highly conformal mask layer 347 on or above the previously formed mask layer 341. In illustrative embodiments, the layer 347 may be provided in the form of a material having a pronounced etch selectivity with respect to the layer 341. For example, for material systems including silicon dioxide and silicon nitride, a plurality of highly anisotropic etch recipes are available, which have a pronounced etch selectivity. It should be appreciated, however, that any other material system for the layers 341, 347 may be used, as long as the layer 347 may be selectively patterned with respect to the layer 341, i.e., the layer 341 may act as an efficient stop layer upon patterning the layer 347, and vice versa.

Similarly, as discussed above, the deposition process 346 may be established on the basis of appropriate process parameters which result in a highly conformal deposition of the layer 347, so that a corresponding thickness 347T may be controlled with high precision, for instance, by using ALD techniques. Consequently, the thickness 347T may substantially correspond to a width of a critical active region still to be formed, as, for instance, also discussed in the context of FIG. 2 when referring to the pattern 245.

It should be noted that a global material removal process may be applied in some cases, if a corresponding global thickness non-uniformity may be considered inappropriate, for instance, with respect to the first device region 300A and the second device region 300B. In this case, for instance, a planarization process, for instance, in the form of CMP (chemical mechanical polishing) may be provided in order to obtain a planarized global surface topography.

FIG. 3E schematically illustrates the semiconductor device 300 in a further advanced manufacturing stage. As illustrated, the device as shown in FIG. 3D may be exposed to an etch process 348 performed as a highly anisotropic process in order to form respective "sidewall spacer" elements 347S from the mask layer 347 (see FIG. 3D). To this end, any well-established anisotropic etch recipes may be applied, as are well known in the art for removing the material of the layer 347 (see FIG. 3D), for instance, provided in the form of silicon dioxide, with respect to the material of the layer 341 acting as a stop material, for instance, provided in the form of silicon nitride and the like. It should be appreciated that the spacer elements 347S may be considered as sidewall spacer elements of the mask elements 335A . . . 335F with an intermediate layer, i.e., the mask layer 341 that actually defines the lateral distance between the mask elements 335A . . . 335F and the respective sidewall spacer elements 347S. Moreover, as is evident from FIG. 3E, in some illustrative embodiments, the thickness of the layer 341 is selected so as to substantially completely fill the space between neighboring mask elements, such as the mask elements 335A, 335B on the one hand, and the mask elements 335C and 335D on the other hand. In other illustrative embodiments (not shown), material of the layer 347 may also be present in respective spaces between these mask elements, as, for instance, illustrated for the mask elements 335E, 335F. In this case, these unwanted material residues may be removed during the further processing on the basis of a further lithography process, as will be discussed in the following.

FIG. 3F schematically illustrates the semiconductor device 300 in a further advanced manufacturing stage in which an etch mask 349, formed of any appropriate material, such as resist material, polymer material and the like, may be formed above the first device region 300A, while the second device region 300B may remain exposed. To this end, a respective non-critical lithography step may be applied so as to form the etch mask 349. Thereafter, an etch process 350 may be performed so as to remove exposed portions of the mask layer 347 (see FIG. 3D) from above the second device region 300B. Consequently, the respective sidewall spacer elements 347S and other material residues 347R may be efficiently removed during the process 350. For example, the process 350 may be based on a wet chemical etch recipe, wherein the layer 341 may be efficiently used as an etch stop material.

As discussed above, when respective material residues may still be present between neighboring mask elements 335A, 335B, for instance, when the initial thickness of the layer 341 may not be sufficient to substantially completely fill any respective spaces, thereby leaving residues such as the residue 347R, any such material residues may also be removed during the process 350. To this end, the etch mask 349 may be formed so as to provide a respective opening above respective neighboring mask elements 335A, 335B, thereby enabling the removal of any material residues. It should be appreciated that any such openings in the etch mask 349 may be considered as non-critical mask elements, since, for instance, neither the respective pitch nor the overlay accuracy are critical, since a variation in width and overlay accuracy may not be relevant as long as the respective opening provides access to the residual material during the etch process 350. Consequently, even in such a case, the etch mask 349 may not have an effect on the critical pitch previously defined by the deposition processes.

FIG. 3G schematically illustrates the semiconductor device 300 after completion of the above-described process sequence. That is, the sidewall spacers 347S and the residual material 347R in the second device region 300B have been removed so as to avoid any effect of these material residues on the further processing, i.e., the lateral dimensions of active regions still to be formed. As an alternative embodiment, it is to be noted that steps described in the context of FIG. 3F and FIG. 3G, i.e., the deposition of layer 347 and the patterning the same, may be performed before the step described with reference to FIG. 3E. That is, the material of the layer 347 may be removed from the device region 300B prior to forming the "sidewall spacers" 347S.

FIG. 3H schematically illustrates the semiconductor device 300 after removal of the etch mask 349 (see FIG. 3G). Consequently, the sidewall spacer elements 347S and the mask layer 341 may be exposed in the first device region 300A, while, in the second device region 300B, the mask elements 335E, 335F may no longer include any sidewall spacer elements. The removal of the etch mask 349 may be accomplished on the basis of well-established removal techniques.

Figure 3I:
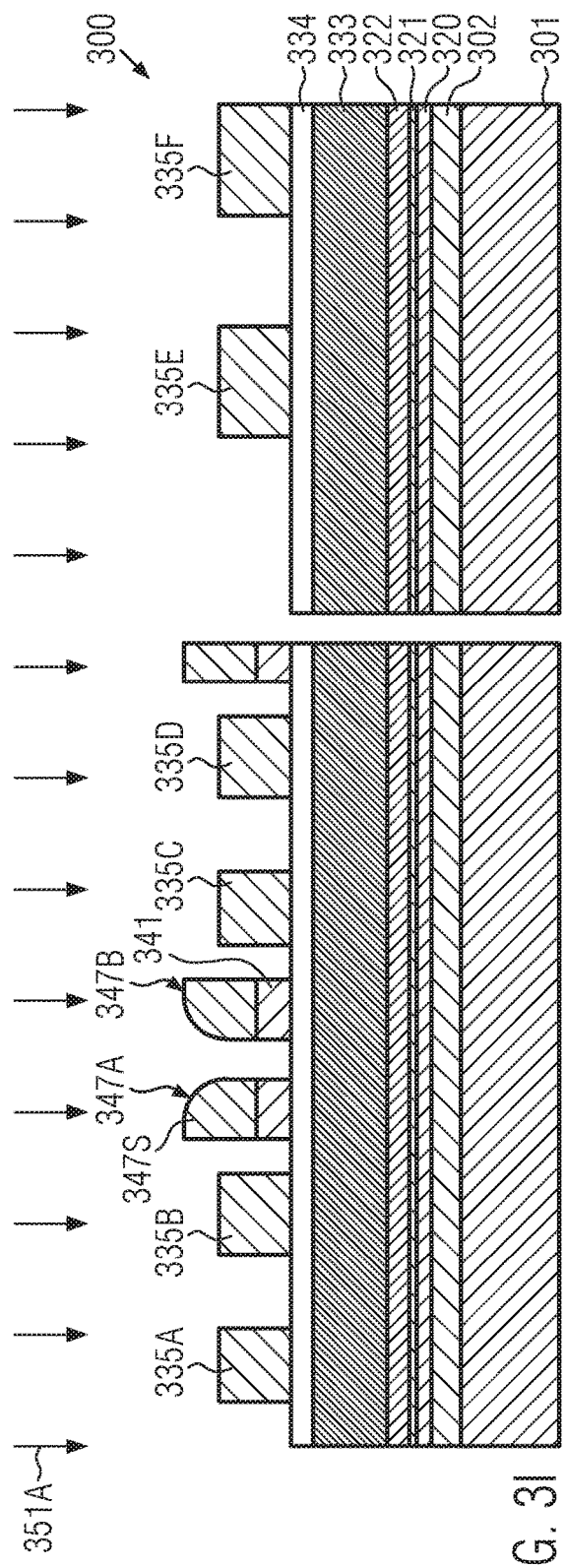
FIGS. 3A-3N schematically illustrate cross-sectional views of a semiconductor device during various manufacturing stages in patterning active regions for planar transistor elements on the basis of the concept as shown in FIG. 2, according to illustrative embodiments.
FIG. 3O schematically illustrates a top view of a portion of the semiconductor device of FIG. 3N or of its layout, thereby providing active regions with width dimensions obtained on the basis of a single lithography process, wherein a smallest pitch is outside the capabilities of the initially applied lithography process.

FIG. 3I schematically illustrates the semiconductor device 300 when exposed to a further anisotropic etch process 351A, in which the layer 341 may be selectively etched with respect to the materials of the mask elements 335A . . . 335F and the sidewall spacers 347S. For example, as also discussed above, highly selective etch recipes for a plurality of material systems are well known in the art, such as anisotropic etch recipes for selectively etching silicon nitride with respect to silicon dioxide. Consequently, during the etch process 351A, material of the layer 341 may be increasingly removed from horizontal device areas, thereby forming respective further or second mask elements 347A, 347B on the basis of the sidewall spacer elements 347S, while respective residues of the mask layer 341 may also be part of the respective mask elements 347A, 347B. On the other hand, in the second device region 300B, the layer 341 may be substantially completely removed from the mask elements 335E, 335F. It should be noted that the process 351A may be performed so as to remove the entire height of the layer 341 in any areas in which the layer 341 is not covered by sidewall spacer elements or mask elements 335A . . . 335F. Depending on the etch selectivity of the layer 334, this may result in a certain etching into and even etching through the layer 334 at respective areas, which, however, may not unduly affect the further processing, since the mask layer 333 may still accommodate any such differences in penetration depth of the etch front of the process 351A.

Figure 3J:
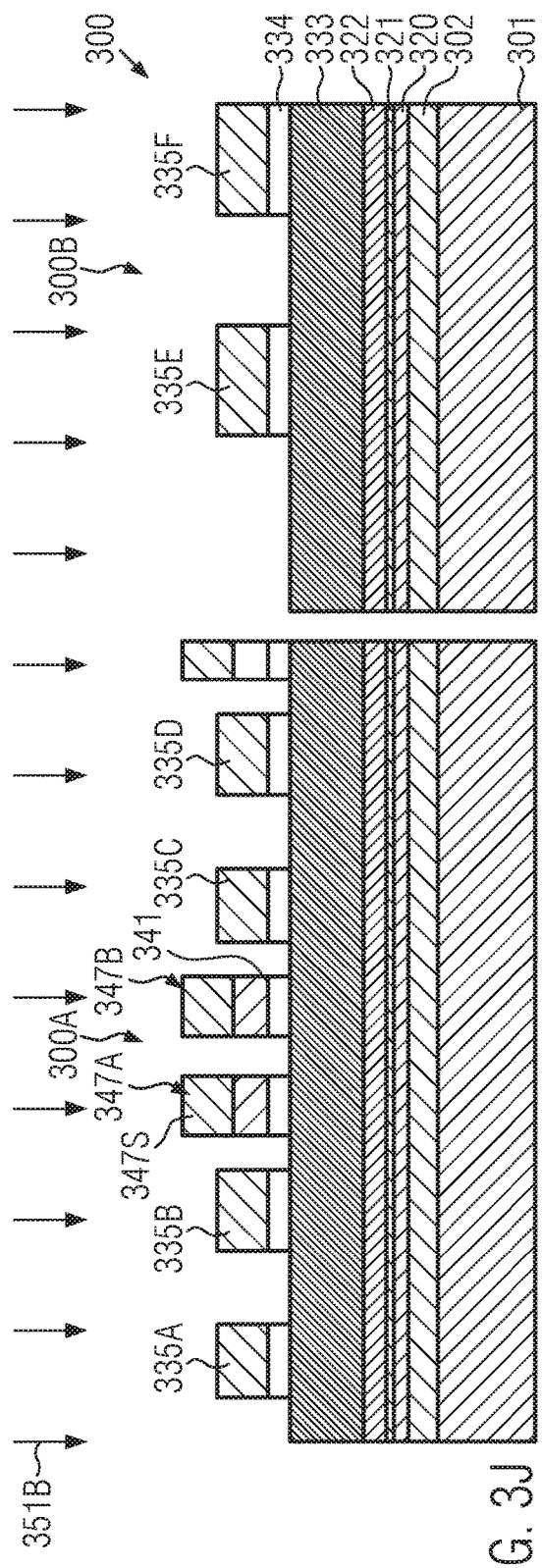
Figure 30:
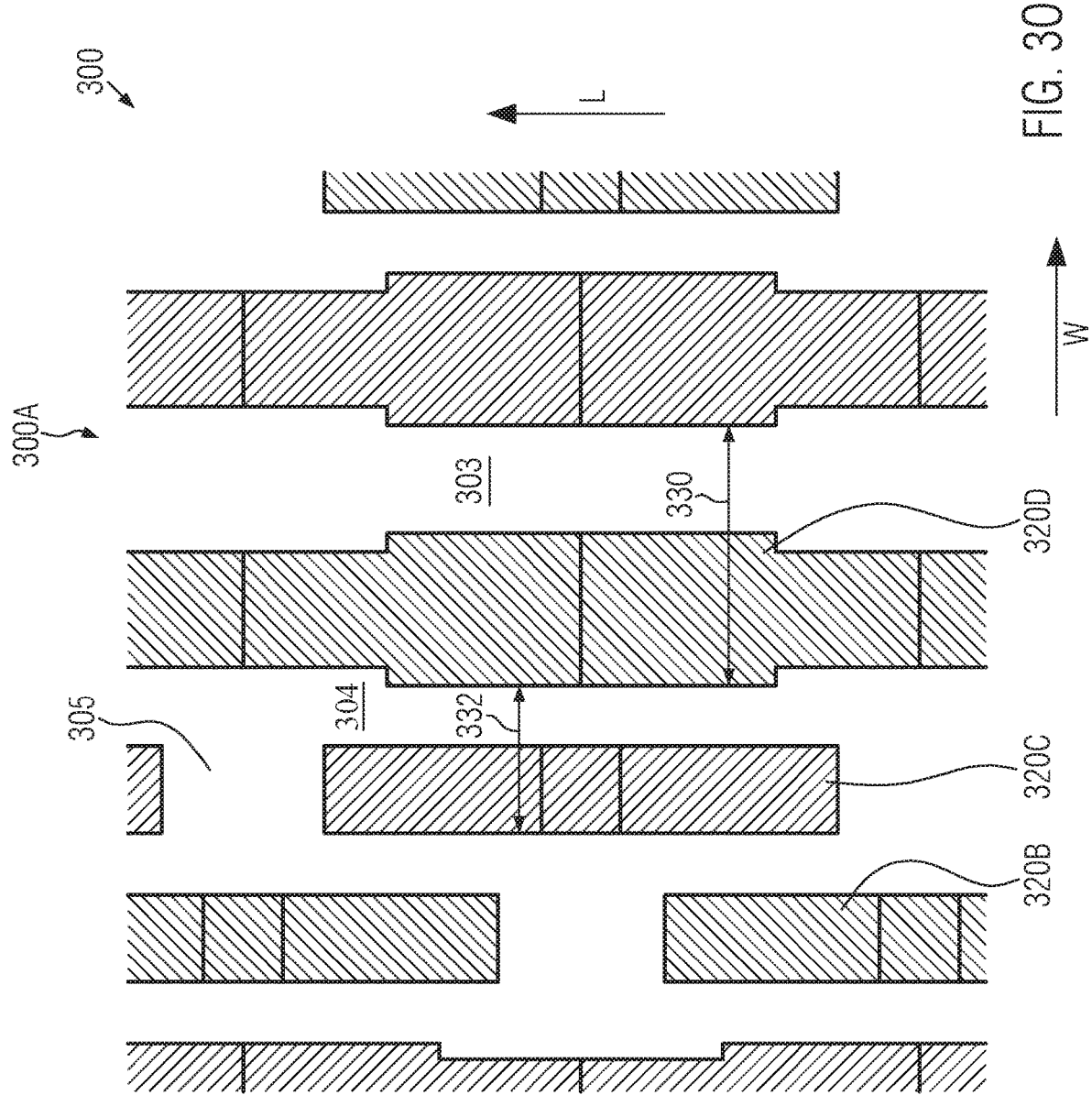

FIG. 3J schematically illustrates the semiconductor device 300 in a further advanced manufacturing stage. As shown, a further etch process 351B may be performed or the process 351B may represent a continuation of the process 351A (FIG. 3I) so as to etch through the layer 334, as discussed above. In this case, the layer 333 may represent a stop layer or may at least have a reduced removal rate compared to the material of the layer 334, thereby "equalizing" or "leveling" to a certain extent the penetration depth of the respective etch front. Consequently, the layer 334 may be patterned on the basis of the mask elements 335A . . . 335D in the first device region 330A in combination with the second mask elements 347A, 347B, while in the second device region 300B, the previously formed mask elements 335E, 335F may still define the pattern of active regions to be formed in the second device region 300B.

On the basis of the first and second mask elements 335A . . . 335D and 347A, 347B, which already define the width dimension of stripes of active regions and spaces or isolation regions in the first device region 300A, the further processing may be continued by increasingly transferring the respective mask pattern into the lower lying material layers, such as the layer 333.

FIG. 3K schematically illustrates the semiconductor device 300 in a further advanced stage of the patterning process, wherein a mask pattern 353, which may include respective mask elements formed of the material residues of the layers 341, 334 and 333 may be obtained by, for instance, etching through the material 333, which may also result in the consumption of the mask elements 335A . . . 335F and of the upper portions of the mask elements 347A, 347B (see FIG. 3J). Consequently, the mask pattern 353 may still represent the lateral dimensions as defined by the first and second mask elements 335A . . . 335D and 347A, 347B (see FIG. 3J). During the patterning process for forming the mask pattern 353, a respective anisotropic etch process may be applied, which may have a pronounced etch selectivity with respect to the layer 322.

FIG. 3L schematically illustrates the semiconductor device 300 in a further advanced stage of the overall patterning process, wherein an etch process may be applied so as to etch through the mask layer 322, while using the layer 321 as a stop material. For example, respective etch processes for etching through the material 322 and using the layer 321 as a stop material are well established in the art, since this material system may be used for forming isolation trenches and stripes for many types of semiconductor devices. During the respective etch process, material of the layers 341 (see FIG. 3K) and the layer 334 may also be increasingly removed, however, without affecting the further processing, since the elements of the mask pattern 353 may still have sufficient height so as to act as efficient etch masks during the further processing of the device 300.

FIG. 3M schematically illustrates the semiconductor device 300 in a further advanced stage. As illustrated, the patterning sequence has been continued so as to etch through the stop layer 321, the semiconductor layer 320 and, if provided, through the buried insulating layer 302 and into the substrate material 301. In this phase of the patterning process, well-established etch recipes may also be applied, as are also typically used in forming deep and shallow isolation trenches. During the patterning sequence, the material 333 may be increasingly consumed, while still providing sufficient etch fidelity in order to obtain respective isolation trenches, such as trenches 303, 304 with a desired lateral width along the width direction W. Similarly, in the first device region 300A, respective active regions or stripes of active regions 320A . . . 320D may be obtained in accordance with the lateral dimensions as defined by the first and second mask elements 335A . . . 335D and 347A, 347B (see FIG. 3I) and subsequently provided by the mask pattern 353 (see FIG. 3L). On the other hand, active regions or stripes thereof 320K, 320L may be provided with appropriate lateral dimensions in combination with a trench 303L, wherein these lateral dimensions are basically defined by the initial resist mask 339 (see FIG. 3A).

FIG. 3N schematically illustrates the semiconductor device 300 in a manufacturing stage in which the final depth of the isolation trenches 303, 304 may be reached, while the material residues of the layer 333 (see FIG. 3M) may also be removed. To this end, any well-established patterning strategies may be applied in combination with respective cleaning processes and the like, as are well established in the art. In this manufacturing stage, a further patterning sequence on the basis of a further lithography process may be applied, commonly referred to by 355, which may include the deposition of appropriate planarization materials and a lithography layer stack, as also previously described, followed by a lithography process, such as an immersion-based ArF process in order to obtain an etch mask (not shown) for delineating the active regions or stripes of active regions 320A . . . 320L in a direction perpendicular to the width direction W, i.e., in FIG. 3N, the direction perpendicular to the drawing plane of FIG. 3N. Since, at least in densely packed device regions the corresponding separation along the length direction may require precisely defined and reduced spaces, the lithography involved in the sequence 355 may typically have to be performed on the basis of a minimum resolution capability of the sequence 355. During the process sequence 355, also connections to the substrate material 301 may be formed, i.e., the buried insulating layer may be removed so as to enable the formation of contact regions that may directly connect to specifically doped semiconductor regions, also known as back gate, used for connecting these regions to a specific reference potential, such as ground potential, Vdd and the like.

FIG. 3O schematically illustrates a top view of the semiconductor device 300 or a design layout thereof. As illustrated, a plurality of active regions in the first device region 300A may be provided with appropriate dimensions along the width direction in compliance with the required device criteria. For example, the active region 320D, which may correspond to the active region of a pull-down transistor of a RAM cell, may have dimensions in combination with the width of the isolation region 303 so as to correspond to the pitch 330 as initially defined by the resist mask 339 (see FIG. 3A). When continuing along the length direction L of the active region 320D, the respective width dimension may be slightly reduced so as to comply with the width requirements for a pass gate transistor.

Furthermore, a plurality of active regions for pull-up transistors, such as active regions 320C, 320B, may be provided with appropriate width so as to correspond, in combination with a width of a separating isolation region, such as the region 304, to the critical or smallest pitch 332, which is basically defined by deposition processes, as discussed above in the context of FIG. 2 and FIGS. 3A-3N. For example, in sophisticated applications, the pitch 332 may be in the range of approximately 80 nm and even less, while the pitch 330 may be selected to be approximately 130 nm or less, depending on the sophistication of the respective lithography process used for forming the initial resist mask 339 (see FIG. 3A).

It should be appreciated that respective isolation regions 305 separating respective active regions, such as active regions 320C for pull-up transistors, may be formed on the basis of the process sequence 355, as illustrated in and explained in the context of FIG. 3N. Moreover, when forming the isolation regions 305, it may also be etched so as to connect to the substrate material 301 (see FIG. 3N) in order to provide contact areas for connecting to the substrate material, which may be advantageous in providing an appropriate reference potential to the semiconductor material positioned below the buried insulating layer 302 (see FIG. 3N). Any such contact regions may be provided for a plurality of RAM cells, since, typically, a correspondingly appropriately doped semiconductor material in the substrate 301 below respective transistor elements, also referred to as back gate, may be provided for a plurality of RAM cells, thereby requiring only a single contact region for a respectively grooved plurality of RAM cells.

As a result, the present disclosure provides manufacturing techniques for forming sophisticated semiconductor devices in which critical dimensions in one lateral direction may be required in densely packed device areas, such as RAM areas, which may not be within the reach of a single lithographic process, thereby conventionally requiring a sequence of mutually overlaid lithography processes. Consequently, the respective associated overlay errors and other imperfections associated with the sequence of lithography processes may finally translate into significant device variations, which may hinder further device scaling. On the other hand, according to the principles disclosed herein, the most critical pitch in densely packed device areas may be defined on the basis of two deposition processes, in combination with a single lithography step, thereby "replacing" lithography and overlay-related variations by reduced parameter variations of highly controllable deposition processes, which may contribute to significantly reduced device variations and provide the potential of further scaling critical dimensions in densely packed device areas, such as RAM areas, which may be formed on the basis of planar transistor architecture. Hence, even for a non-regular pattern layout of RAM cells, as is typically required due to the planar transistor architecture of the cell transistors, as for instance shown in FIG. 3O, an efficient patterning strategy may be accomplished. It should be appreciated that the principles disclosed herein are advantageous in forming semiconductor devices having reduced lateral dimensions compared to the 22 nm generation of planar transistor architecture. In other embodiments, the principle of the present disclosure may also be applied to less critical applications, thereby still contributing to reduced manufacturing complexity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming first mask elements from a hard mask layer on the basis of a resist mask, said hard mask layer being formed above a semiconductor layer of a semiconductor device;
   conformally depositing a first mask layer above said first mask elements;
   conformally depositing a second mask layer above said first mask layer, said second mask layer having etch selectivity with respect to said first mask layer;
   forming a plurality of second mask elements from said first and second mask layers between two immediately adjacent first mask elements, wherein a spacing between said plurality of second mask elements differs from a spacing between said two immediately adjacent first mask elements and said plurality of second mask elements, wherein forming the second mask elements comprises etching the second mask layer selectively to the first mask layer to form sidewall spacer elements at sidewalls of the first mask layer and etching said first mask layer selectively to said sidewall spacer elements and said first mask elements to form the plurality of second mask elements between the two immediately adjacent first mask elements; and
   forming stripes of active regions from said semiconductor layer by using said first and second mask elements as an etch mask, wherein a width of and space between stripes formed by using said second mask elements forms a smallest pitch of said stripes of active regions.

2. The method of claim 1, wherein forming said stripes of active regions comprises etching through said semiconductor layer and a buried insulating layer formed below said semiconductor layer and into a substrate material.

3. The method of claim 1, wherein said resist mask is formed by applying a lithography process using an immersion technique.

4. The method of claim 1, wherein said resist mask is formed by applying a non-immersion lithography process.

5. The method of claim 1, wherein said smallest pitch is approximately 80 nm or less.

6. The method of claim 1, wherein said stripes of active regions comprises a group of active regions of a static RAM cell.

7. The method of claim 1, further comprising providing a first device region and a second device region and forming said first mask elements in said first device region and forming concurrently further mask elements in said second device region, wherein said further mask elements differ from said first mask elements in width.

8. The method of claim 1, wherein a minimum thickness of said first mask layer is at least half of a distance between at least two of said first mask elements that have a smallest distance so as to pinch off a spacing between said at least two of said first mask elements.

9. A method of forming active regions in a semiconductor device, the method comprising:
   forming a pattern of first mask elements based on a first lithography process;
   forming second mask elements in between two immediately adjacent first mask elements by applying a sequence of deposition processes;
   separating a semiconductor layer into a plurality of active regions along a width direction by using said first and second mask elements as an etch mask; and
   separating said plurality of active regions along a length direction on the basis of a second lithography process, wherein forming said pattern of first mask elements comprises forming said pattern in a first device region and concurrently forming a further pattern of mask elements in a second device region, wherein said pattern and said further pattern differ in at least a pitch along a width direction,
   wherein forming the second mask elements comprises conformally depositing a first mask layer and a second mask layer and forming sidewall spacer elements from the second mask layer by etching the second mask layer selectively to the first mask layer and etching the first mask layer selectively to the sidewall spacer elements and the first mask elements to form the second mask elements between the two immediately adjacent first mask elements.

10. The method of claim 9, wherein said active regions formed on the basis of said second mask elements have a smallest pitch formed by a space and width.

11. The method of claim 10, wherein said smallest pitch is approximately 80 nm or less.

12. The method of claim 9, further comprising forming a mask above said first device region and selectively removing at least one layer formed during said sequence of deposition processes from above said second device region prior to forming said second mask elements.

13. A method of forming stripes of active regions of a semiconductor device, the method comprising:
- forming a resist mask above a stack of layers including a semiconductor layer and a hard mask layer above said semiconductor layer;
- patterning said hard mask layer by using said resist mask so as to form first mask elements from said hard mask layer;
- depositing a first mask layer above said first mask elements;
- depositing a second mask layer above said first mask layer;
- etching said second mask layer selectively to said first mask layer so as to form sidewall spacer elements on said first mask layer adjacent to sidewalls of said first mask elements;
- etching said first mask layer selectively to said sidewall spacer elements and said first mask elements so as to form second mask elements from said sidewall spacer elements, wherein a plurality of second mask elements are positioned between immediately adjacent first mask elements, wherein a spacing between said plurality of second mask elements differs from a spacing between said two immediately adjacent first mask elements and said plurality of second mask elements; and
- etching through said semiconductor layer and using said first and second mask elements as an etch mask.

14. The method of claim 13, further comprising selecting a thickness of said first and second mask layers so as define a width and space of said second mask elements of approximately 80 nm or less.

\* \* \* \* \*